(12) United States Patent
Chen et al.

(10) Patent No.: US 11,005,461 B2
(45) Date of Patent: May 11, 2021

(54) LEVEL SHIFT LATCH CIRCUITRY

(71) Applicant: Arm Limited, Cambridge (GB)

(72) Inventors: Andy Wangkun Chen, Austin, TX (US); Sai Sriharsha Manapragada, Austin, TX (US); Yicong Li, Austin, TX (US); Yew Keong Chong, Austin, TX (US); Bikas Maiti, Austin, TX (US); Sanjay Mangal, Austin, TX (US); Hsin-Yu Chen, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/004,009

(22) Filed: Jun. 8, 2018

(65) Prior Publication Data

US 2019/0379364 A1 Dec. 12, 2019

(51) Int. Cl.
*H03K 3/356* (2006.01)
*H03K 17/22* (2006.01)

(52) U.S. Cl.
CPC ..... *H03K 3/356113* (2013.01); *H03K 17/223* (2013.01)

(58) Field of Classification Search
CPC .......... H03K 3/356; H03K 3/356008–356043; H03K 3/356052; H03K 3/35606; H03K 3/356069–3/3565; H03K 17/223
USPC ....................................................... 327/143
See application file for complete search history.

(56) References Cited

U.S. PATENT DOCUMENTS

| | | | | |
|---|---|---|---|---|
| 2005/0068062 A1* | 3/2005 | Yamasaki | ........ | H03K 3/356113 326/81 |
| 2016/0294373 A1* | 10/2016 | Grubelich | ........ | H03K 3/356104 |
| 2018/0287609 A1* | 10/2018 | Mallavajula | ....... | H03K 19/0013 |

* cited by examiner

*Primary Examiner* — Patrick C Chen
(74) *Attorney, Agent, or Firm* — Pramudji Law Group PLLC; Ari Pramudji

(57) ABSTRACT

Various implementations described herein are directed to an integrated circuit having first devices arranged to operate as a latch. The first devices may include inner devices and outer devices. The integrated circuit may include second devices coupled to the first devices and arranged to operate as a level shifter. The second devices may include upper devices and lower devices. The lower devices may be cross-coupled to gates of the inner devices and the upper devices. The integrated circuit may include input signals applied to gates of the outer devices and the lower devices to thereby generate output signals from the outputs of the lower devices that are applied to the gates of the inner devices and the upper devices to activate latching of the output signals.

8 Claims, 6 Drawing Sheets

LEVEL SHIFT LATCH CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional circuit designs, memory typically has a power-up sequence that designers must follow to avoid direct-current (DC) paths. For instance, some core voltage related memory must be powered on first and then powered down later so as to avoid excessive leakage. Also, in some instances, the core voltage and periphery voltage must be on during normal operation for both power-gating (PG) and non-PG instances. If PG pins are in the core voltage range, then the periphery voltage can be powered down, and sometimes, the core voltage can be lowered for operating in a retention mode. Also, in some instances, retention voltage level can be determined by a technology node and its bitcells. However, conventional circuit designs related to the retention mode can be inefficient and consume a large area.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to level shift latch circuitry and power-on-reset (POR) circuitry. For instance, some implementations described herein are related to circuitry that enables flexible power-up and power-down sequence in various memory applications. In some implementations, a retention signal may be used to inhibit or prevent a DC path from being generated and inhibit or prevent an unnecessary retain state. In this instance, for initial power-up, various schemes and techniques described herein allow for power-up/power-down sequences as long as one power supply is fully ramped-up before another power supply starts ramping-up.

Various implementations of level shift latch circuitry will now be described in detail herein with reference to FIGS. 1-6.

Figure 1:
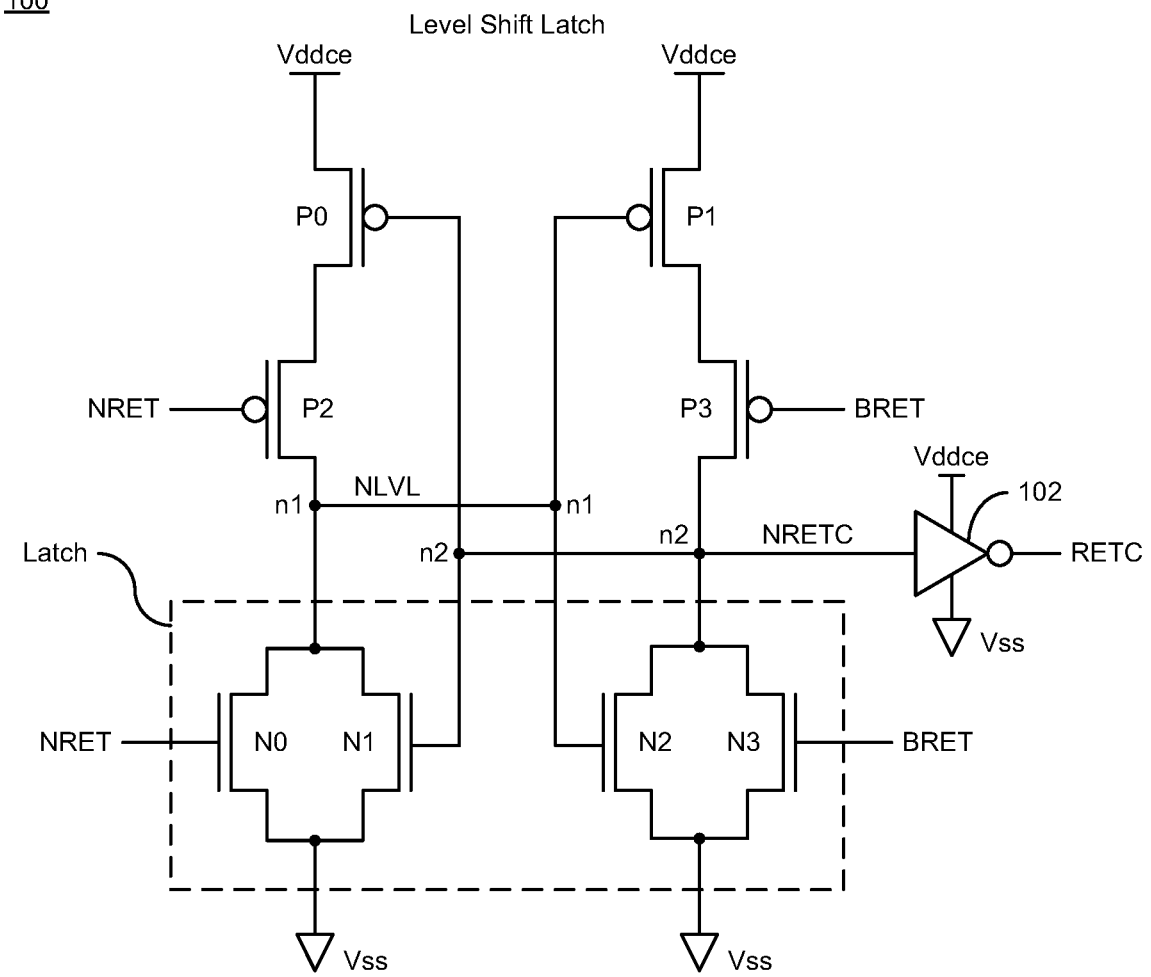
FIG. 1 illustrates a diagram of level shift latch circuitry in accordance with various implementations described herein.

FIG. 1 illustrates a diagram of level shift latch circuitry 100 in accordance with various implementations described herein. In some implementations, the level shift latch circuitry 100 may be fabricated as an integrated circuit (IC) that operates with level shifting functionality and latch functionality.

As shown in FIG. 1, the level shift latch circuitry 100 may include first devices (N0, N1, N2, N3) that are arranged to operate as a latch, and the first devices (N0, N1, N2, N3) may include inner devices (N1, N2) and outer devices (N0, N3). The terms inner and outer are relative terms associated with relative positions of the first devices in the circuitry 100 of FIG. 1, and thus, other terms may be used to describe the first devices without altering the scope and functionality of the circuitry 100 in FIG. 1.

In some implementations, as shown in FIG. 1, the first devices (N0, N1, N2, N3) may be implemented with transistors. For instance, the first devices (N0, N1, N2, N3) may be implemented with N-type metal-oxide-semiconductor (NMOS) transistors.

The level shift latch circuitry 100 may include second devices (P0, P1, P2, P3) that are coupled to the first devices (N0, N1, N2, N3) and are arranged to operate as a level shifter. The second devices (P0, P1, P2, P3) may include upper devices (P0, P1) and lower devices (P2, P3), and outputs of the lower devices (P2, P3) are cross-coupled to gates of the inner devices (n1, N2) and the upper devices (P0, P1). The terms upper and lower are relative terms associated with the relative positions of the second devices in the circuitry 100 of FIG. 1, and thus, other terms may be used to describe the second devices without altering the scope and functionality of the circuitry 100 in FIG. 1.

In some implementations, as shown in FIG. 1, the second devices (P0, P1, P2, P3) may be implemented with transistors. For instance, the second devices (P0, P1, P2, P3) may be implemented with P-type MOS (PMOS) transistors.

The level shift latch circuitry 100 may include input signals (NRET, BRET) that may be applied to gates of the outer devices (N0, N3) and the lower devices (P2, P3) to thereby generate output signals (NLVL, NRETC) from the outputs of the lower devices (P2, P3) that are applied to the gates of the inner devices (N1, N2) and the upper devices (P0, P1) to activate latching of the output signals (NLVL, NRETC).

In some implementations, the input signals (NRET, BRET) may include a first retention signal (NRET) and a second retention signal (BRET), and the output signals may include feedback signals, e.g., including a first feedback signal (NLVL) and a second feedback signal (NRETC). As shown in FIG. 1, the first feedback signal (NLVL) may be output from a first lower device (P2) of the lower devices at node n1 and applied to the gate of a first inner device (n2) of the inner devices from node n1 and the gate of a first upper device (P1) of the upper devices from node n1. Further, the second feedback signal (NRETC) may be output from a second lower device (P3) of the lower devices at node n2 and applied to the gate of a second inner device (N1) of the inner devices from node n2 and the gate of a second upper device (P0) of the upper devices from node n2. Further, as shown in FIG. 1, the input signals (NRET, BRET) may be applied to the gates of the outer devices (N0, N3) and the lower devices (P2, P3) to activate retention control.

The level shift latch circuitry 100 may include a logic gate 102 that is coupled to the output of the second lower device (P3) of the lower devices at node n2, and the logic gate 102 may receive the second retention signal (NRETC) from the second lower device (P3) of the lower devices from node n2. In some instances, the logic gate 102 may be implemented with an inverter, and in this instance, the inverter may receive and invert the second retention signal (NRETC) so as to provide a complementary retention signal (RETC) as a retention control output signal of the circuitry 100.

In some implementations, the level shift latch circuitry 100 may operate in the first voltage domain (Vddce), wherein as shown in FIG. 1, the circuitry 100 and related components are coupled between a first voltage source in the first voltage domain (Vddce) and a second voltage source (Vss) or ground (GND). Also, as shown, the level shift latch circuitry 100 may include a retention signal generation circuit 104 that operates in the second voltage domain (Vddsoce). For instance, the input signals may include the first retention signal (NRET) and the second retention signal (BRET) along with a retention control signal (RET). As shown, the retention control signal (RET) may be provided as input to an inverter 112 so as to invert and generate the first retention signal (NRET), and the first retention signal (NRET) may be provided as input to another inverter 114 so as to invert and generate the second retention signal (BRET). Thus, in this instance, the first retention signal (NRET) may then be provided to the devices (P2, N0), and the second retention signal (BRET) may then be provided to the devices (P3, N3).

The level shift latch circuitry 100 may be implemented as an integrated circuit (IC) in using various types of memory applications, such as, e.g., random access memory (RAM), including static RAM (SRAM), and/or any other types of volatile memory. In some implementations, the level shift latch circuitry 100 may be implemented as an IC with dual rail memory architecture and various related circuitry. The level shift latch circuitry 100 may be integrated with computing circuitry and related components on a single chip. Also, the level shift latch circuitry 100 may be implemented in embedded systems for various electronic, mobile, automotive and other related applications, including low power sensor nodes for IoT (Internet of things) applications.

In some implementations, the second voltage domain (Vddsoce) may power down for retention mode when the first voltage domain (Vddce) is still on even though the PG control pin information is lost due to floating after Vddsoce power down. The internal Vddsoce header may be on, but the input pins (i.e., Data/Address) are floating, because they are also in Vddsoce domain. To avoid creating a DC path in the interface of Vddsoce and Vddce, FIG. 1 illustrates level shift latch circuitry 100 to hold the PG control signal value in the Vddce domain when the PG pins are in Vddsoce domain, and the Vddsoce domain is floating.

Figure 2:
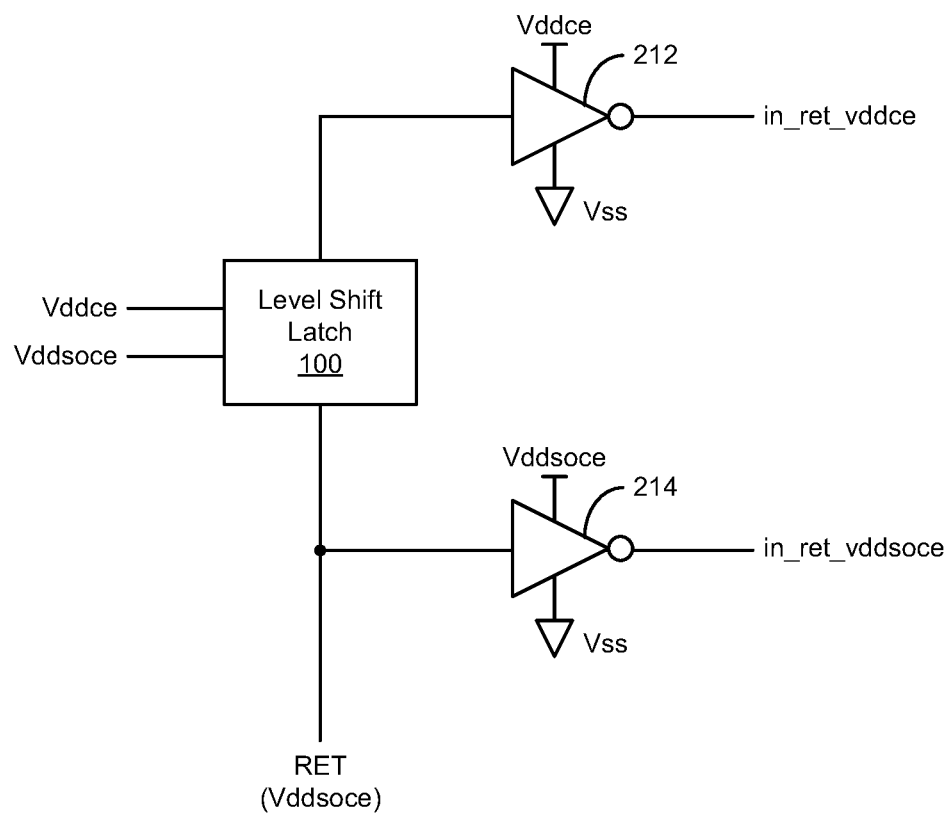
FIG. 2 illustrates a diagram of control signal generation circuitry using level shift latch circuitry in accordance with various implementations described herein.

FIG. 2 illustrates a diagram of control signal generation circuitry 200 that uses the level shift latch circuitry 100 of FIG. 1 in accordance with various implementations described herein. In reference to FIG. 2, components described therein are similar in scope and functionality to related components as shown and described in FIG. 1.

As shown in FIG. 2, the control signal generation circuitry 200 may include the level shift latch circuitry 100 of FIG. 1, a first buffer 212 that operates in the first voltage domain (Vddce), and a second buffer 214 that operates in the second voltage domain (Vddsoce). As described herein above, the level shift latch circuitry 100 may receive a first source voltage in the first voltage domain (Vddce) and a second source voltage in the second voltage domain (Vddsoce). In some implementations, the level shift latch circuitry 100 may up-shift the voltage from the second voltage domain (Vddsoce) to the first voltage domain (Vdcce). In some instances, the level shift latch circuitry 100 may latch the retention control signal (RET) after the second voltage domain (Vddsoce) powers-down. Also, in some instances, the level shift latch circuitry 100 may latch the retention control signal (RET) after the second voltage domain (Vddsoce) powers-down and when the retention control signal (RET) is floating or stays low.

The level shift latch circuitry 100 may receive the retention control signal (RET) in the second voltage domain (Vddsoce), and the level shift latch circuitry 100 may provide an output signal to the first buffer 212 based on the retention control signal (RET). The first buffer 212 may be coupled to an output of the level shift latch circuitry 100 and thereby receive an output of the level shift latch circuitry 100. The first buffer 212 may provide a first internal retention signal (in_ret_vddce) to drive a portion of external circuitry (e.g., memory circuitry) in the first voltage domain (Vddce) based on the output from the level shift latch circuitry 100. Also, the second buffer 214 may receive retention control signal (RET), and the second buffer 214 may further provide a second internal retention signal (in_ret_vddsoce) to drive another portion of external circuitry (e.g., memory circuitry) in the second voltage domain (Vddsoce) based on the retention control signal (RET). The first and second buffers 212, 214 may be implemented with various types of logic gates, such as, e.g., one or more inverters or NOT gates.

FIG. 2 illustrates the control signal generation circuitry 200 with the level shift latch circuitry 100. In some implementations, with use of the level shift latch circuitry 100, the power control signal (in_ret_vddce) is maintained for the Vddce domain after Vddsoce power down to avoid losing retention information. The power control signal (in_ret_vddce) may still be high after Vddsoce power down, so the Vddce headers may still be off to inhibit or prevent any DC path. The other power control signal (in_ret_vddsoce) may be used to control the headers in Vddsoce domain. The logic that is driving the retention signal (RET) needs to be powered with the same power source as the driver of NRET to make sure NRET stays at logic zero (0). Then, the level shift latch circuitry 100 can latch the correct signal. The external power for the PG pins needs to ramp-up first, because the PG control signal needs to control the headers to ensure that they are all off. Otherwise, DC paths may be created. To enable a flexible power-up sequence, external power needs to be sensed with circuitry to ensure that it blocks the PG pins before all external power is powered-up. Accordingly, FIG. 3 provides power-on-reset (POR) circuitry 300 to assist with sensing external power, and as described herein below, the POR circuitry 300 will block the final NOR gate if Vddsoce or Vddce is still ramping-up, so that NRET is still low and ensures that the internal power gates (PG) are off.

Figure 3:
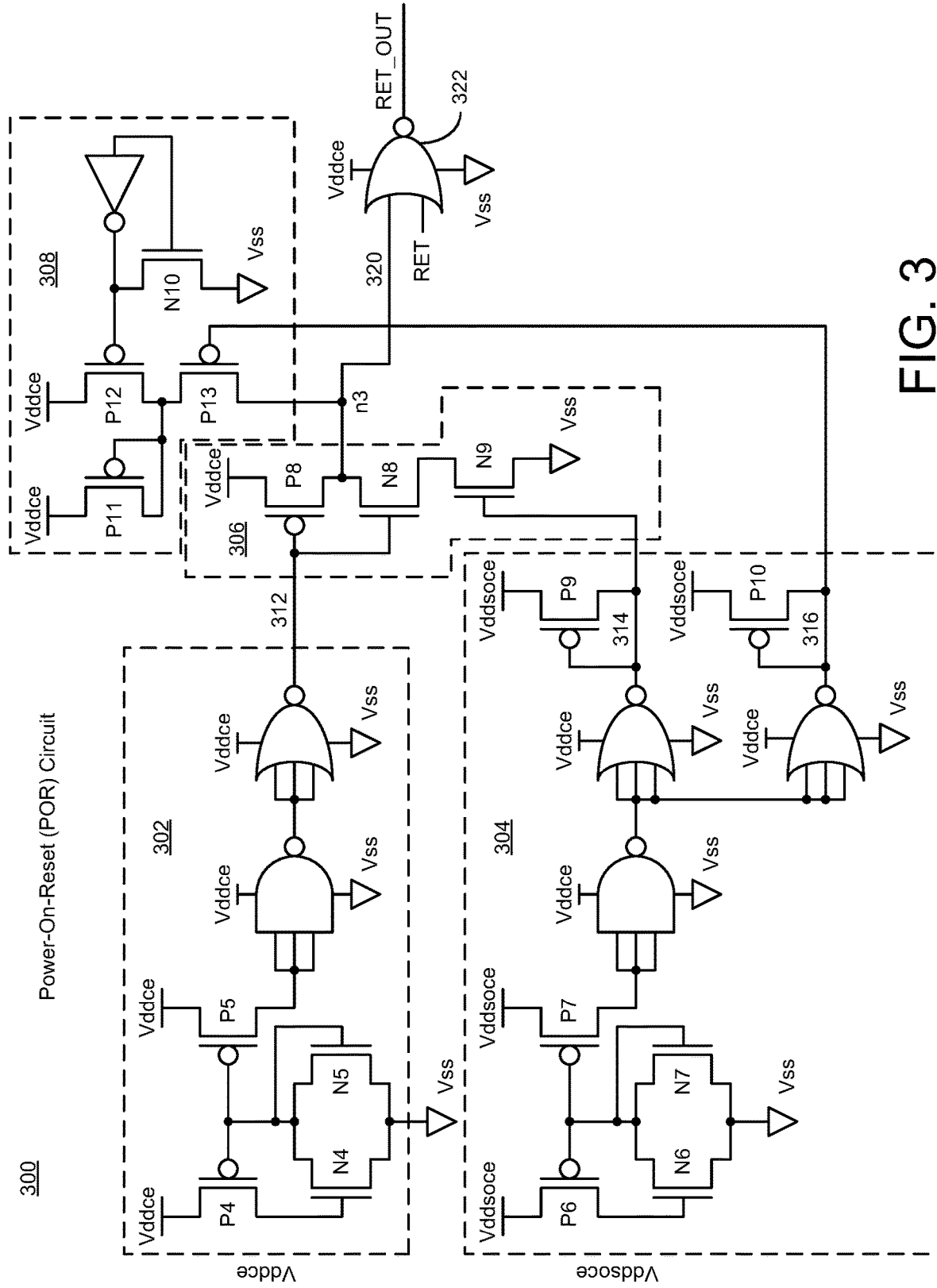
FIG. 3 illustrates a diagram of power-on-reset (POR) circuitry in accordance with various implementations described herein.

FIG. 3 illustrates a circuit diagram of the power-on-reset (POR) circuitry 300 in accordance with various implementations described herein. In some implementations, the POR circuitry 300 may be used to sense external power.

As shown in FIG. 3, the POR circuitry 300 may include a first circuit 302 that operates in a first voltage domain (Vddce). The first circuit 302 includes multiple devices, such as, e.g., transistors P4, P5, N4, N5, a NAND gate and a NOR gate, that are coupled together between multiple source voltages Vddce and Vss (or ground GND) to provide a first control signal 312 to gates of transistors P8, N8. The NAND gate and the NOR gate may be implemented with 3-inputs; however, any number of inputs may be used, and/or any other type of gate may be used to provide similar operation.

Also, the POR circuitry 300 may include a second circuit 304 that operates in a second voltage domain (Vddsoce). The second circuit 304 may include multiple devices, such as, e.g., transistors P6, P7, N6, N7, P9, P10, a NAND gate and NOR gates, that are coupled together between multiple source voltages Vddsoce and Vss (or ground GND) to provide a second control signal 314 to gates of transistors P9, N9. The second circuit 304 may also provide an activation signal 316 to the gate of transistor P10 and also to the gate of transistor P13. The NAND gate and the NOR gates may be implemented with 3-inputs; however, any number of inputs may be used, and/or any other type of gate may be used to provide similar operation.

The POR circuitry 300 may include a logic gate 306 that is coupled to the first circuit 302 and the second circuit 304 so as to receive a first control signal 312 from the first circuit 302 and a second control signal 314 from the second circuit 304 as inputs and provide a third control signal (RET OUT) as an output in the first voltage domain (Vddce) based on the first control signal 312 and the second control signal 314. In some instances, the logic gate 306 may include multiple transistors P8, N8, N9 that are arranged to operate as a NAND gate; however, any number of transistors may be used, and/or any other type of gate may be implemented to provide similar operation.

The POR circuitry 300 may include a third circuit 308 that receives the second control signal 314 from the second circuit 304, holds a retention signal (RET) based on the second control signal 314, and provides the retention signal (RET) to the output of the logic gate 306. In some implementations, the third circuit 308 may hold the retention signal (RET) based on the second control signal 314 when the first voltage domain (Vddce) rises to a high voltage state and when the second voltage domain (Vddsoce) stays in a low voltage state. Further, the third circuit 308 may hold the retention signal (RET) based on the second control signal 314 when the first voltage domain (Vddce) fully powers-up or fully rises to the high voltage state and when the second voltage domain (Vddsoce) starts to power-up or starts to rise to a high voltage state. As shown, the third circuit 308 may include multiple devices, such as, e.g., transistors P11, P12, N13, N10, and an inverter, that are coupled together between multiple source voltages Vddce and Vss (or ground GND) to provide an intermediate signal 320 at node n3 to an output logic gate 322, such as, e.g., a NOR gate.

In some implementations, the second circuit 304 and the third circuit 308 may work together to provide POR functionality and level shifting functionality. As shown, the output logic gate 322 receives the intermediate signal 320 from node n3 and the retention signal (RET), and the output logic gate 322 provides the third control signal (RET OUT) as an output in the first voltage domain (Vddce).

Figure 4:
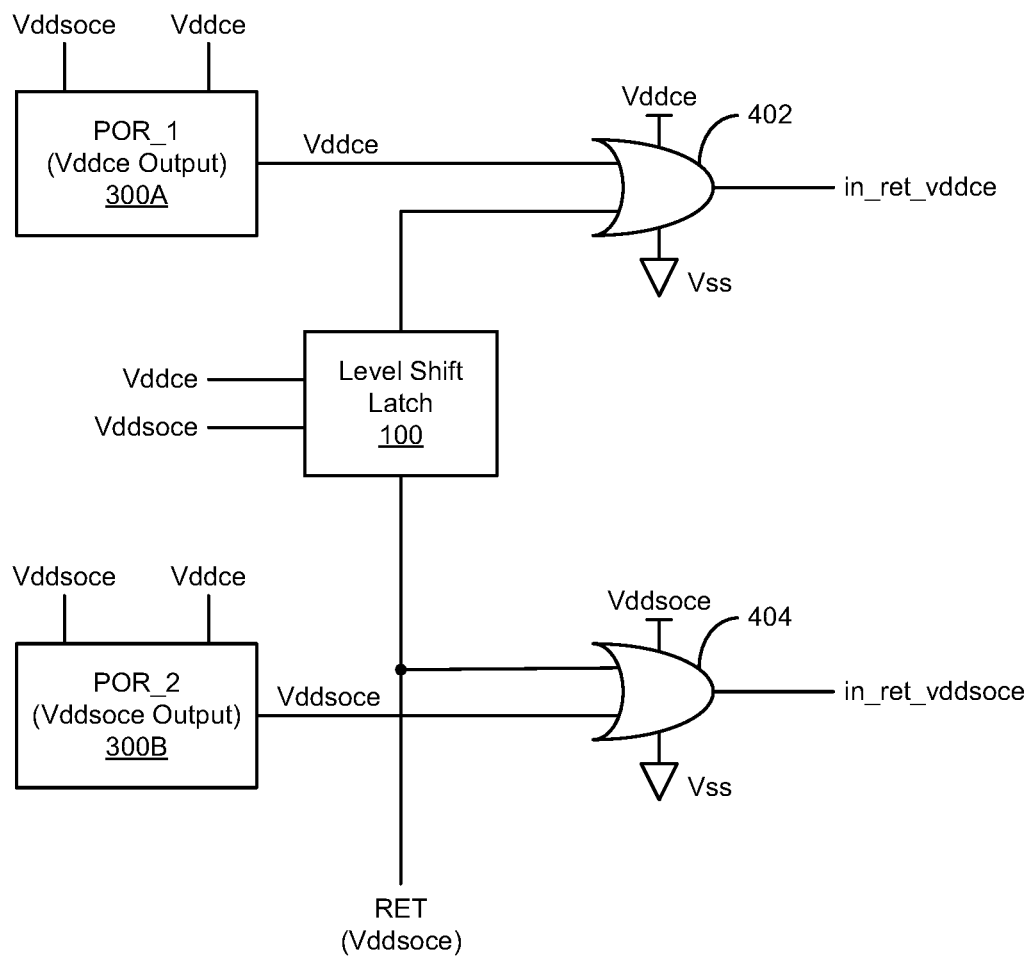
FIG. 4 illustrates a diagram of control signal generation circuitry using power-on-reset (POR) circuitry and level shift latch circuitry in accordance with implementations described herein.

FIG. 4 illustrates a diagram of control signal generation circuitry 400 that uses power-on-reset (POR) circuitry 300A, 300B and the level shift latch circuitry 100 in accordance with various implementations described herein.

As shown in FIG. 4, the control signal generation circuitry 400 may include power-on-reset (POR) circuitry 300A, 300B, e.g., including a first POR circuit 300A for a first voltage domain (Vddce) and a second POR circuit 300B for a second voltage domain (Vddsoce). The control signal generation circuitry 400 may include the level shift latch circuitry 100 that is coupled between the first POR circuit 300A and the second POR circuit 300B. In various implementations, the level shift latch operates with level shifting functionality and latch functionality. The level shift latch circuitry 100 may receive the retention signal (RET). The level shift latch circuitry 100 may up-shift the voltage from the second voltage domain (Vddsoce) to the first voltage domain (Vdcce). The level shift latch circuitry 100 may latch the retention control signal (RET) after the second voltage domain (Vddsoce) powers-down. Also, the level shift latch circuitry 100 may latch the retention control signal (RET) after the second voltage domain (Vddsoce) powers-down and when the retention control signal (RET) is floating or stays low.

The control signal generation circuitry 400 may include a first logic gate 402 that is coupled to an output of the first POR circuit 300A and an output of the level shift latch circuitry 100. The first logic gate 402 may provide the retention signal (RET) in the first voltage domain (Vddce) based on the output from the first POR circuit 300A and the output from the level shift latch circuitry 100.

The control signal generation circuitry 400 may include a second logic gate 404 that receives the retention signal (RET) and is coupled to an output of the second POR circuit 300B. The second logic gate 404 may provide the retention signal (RET) in the second voltage domain (Vddsoce) based on the retention signal (RET) and the output from the second POR circuit 300B.

In this manner, FIG. 4 illustrates the control signal generation circuitry 400 with the level shift latch circuitry 100. In some implementations, the combination of the circuitry 400 with the level shift latch circuitry 100 allows for powering down the Vddsoce domain for the retention mode of operation. In this instance, for initial power-up, the combination of circuitry 400, 100 allows for power-up/power-down sequences as long as one power supply is fully ramped-up before the other power supply starts ramping-up.

Figure 5:
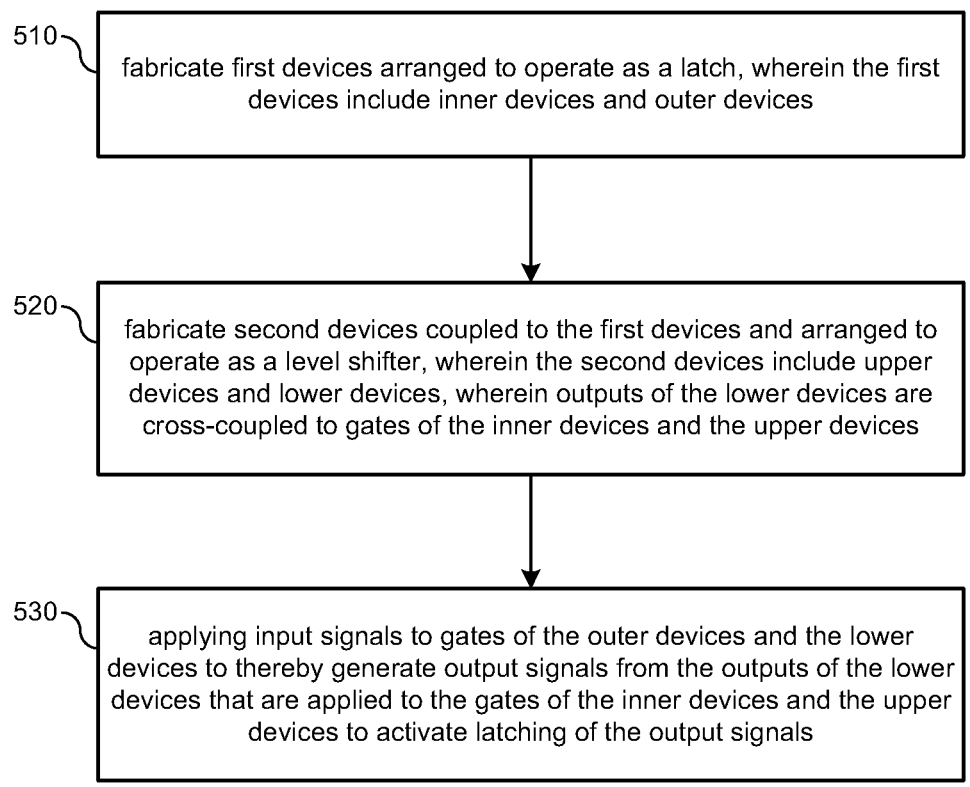
FIG. 5 illustrates a process flow diagram of a method for manufacturing an integrated circuit having level shift latch functionality in accordance with implementations described herein.

FIG. 5 illustrates a process flow diagram of a method 500 for manufacturing an integrated circuit having level shift latch circuitry and functionality in accordance with various implementations described herein.

It should be understood that even though method 500 may indicate a particular order of operation execution, in some cases, various certain portions of the operations may be executed in a different order, and on different systems. In other cases, additional operations and/or steps may be added to and/or omitted from method 500. Method 500 may be implemented in hardware and/or software. If implemented in hardware, method 500 may be implemented with various circuit components, such as those described herein above in reference to FIGS. 1-4. If implemented in software, method 500 may be implemented as a program or software instruction process that may be configured for implementing level shift latch functionality as described herein. Further, if implemented in software, instructions related to implementing the method 500 may be stored in memory and/or a database. For instance, a computer or various other types of computing devices having a processor and memory may be configured to perform method 500.

As described and shown in reference to FIG. 5, method 500 may be used for manufacturing an integrated circuit (IC) that implements level shift latch functionality in various types of memory applications. In some implementations, the integrated circuit (IC) may be implemented as a level shift latch that operates with level shifting functionality and latch functionality.

At block 510, method 500 may fabricate first devices arranged to operate as a latch, wherein the first devices include inner devices and outer devices. The first devices may be implemented with transistors. The first devices may be implemented with N-type metal-oxide-semiconductor (NMOS) transistors.

At block 520, method 500 may fabricate second devices coupled to the first devices and arranged to operate as a level shifter, wherein the second devices include upper devices and lower devices, wherein outputs of the lower devices are cross-coupled to gates of the inner devices and the upper devices. The second devices may be implemented with transistors. The second devices may be implemented with P-type metal-oxide-semiconductor (PMOS) transistors.

At block 530, method 500 may apply input signals to gates of the outer devices and the lower devices to thereby generate output signals from the outputs of the lower devices that are applied to the gates of the inner devices and the upper devices to activate latching of the output signals. The input signals may include a first retention signal (NRET) and a second retention signal (BRET). The output signals may include feedback signals including a first feedback signal (NLVL) and a second feedback signal (NRETC). The first feedback signal (NLVL) may be output from a first lower device of the lower devices and applied to the gate of a first inner device of the inner devices and the gate of a first upper device of the upper devices. The second feedback signal (NRETC) may be output from a second lower device of the lower devices and applied to the gate of a second inner device of the inner devices and the gate of a second upper device of the upper devices.

In some implementations, method 500 may fabricate a logic gate coupled to the output of the second lower device of the lower devices, and the logic gate receives the second retention signal (NRETC) from the second lower device of the lower devices. The logic gate may be implemented with an inverter, and the inverter receives and inverts the second retention signal (NRETC) so as to thereby provide a complementary retention signal (RETC) as a retention control output signal of the integrated circuit. Further, in some instances, the input signals may be applied to the gates of the outer devices and the lower devices to activate retention control.

Figure 6:
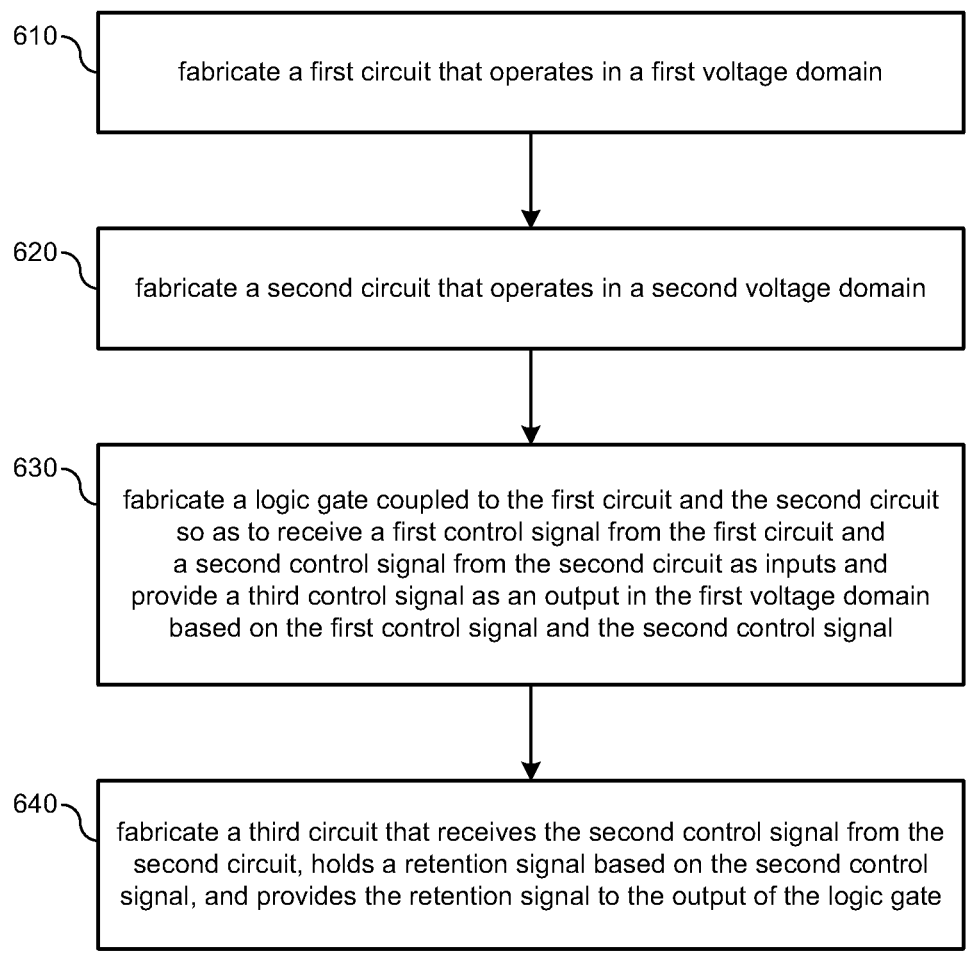
FIG. 6 illustrates a process flow diagram of a method for manufacturing an integrated circuit having power-on-reset (POR) functionality in accordance with various implementations described herein.

FIG. 6 illustrates a process flow diagram of a method 600 for manufacturing an integrated circuit having power-on-reset (POR) circuitry and functionality in accordance with various implementations described herein.

It should be understood that even though method 600 may indicate a particular order of operation execution, in some cases, various certain portions of the operations may be executed in a different order, and on different systems. In other cases, additional operations and/or steps may be added to and/or omitted from method 600. Method 600 may be implemented in hardware and/or software. If implemented in hardware, method 600 may be implemented with various circuit components, such as described herein above in reference to FIGS. 1-4. If implemented in software, method 600 may be implemented as a program or software instruction process that may be configured for implementing POR functionality as described herein. Further, if implemented in software, instructions related to implementing the method 600 may be stored in memory and/or a database. For instance, a computer or various other types of computing devices having a processor and memory may be configured to perform method 600.

As described and shown in reference to FIG. 6, method 600 may be used for manufacturing an integrated circuit (IC) that implements POR functionality in various types of memory applications. At block 610, method 600 may fabricate a first circuit that operates in a first voltage domain. At block 620, method 600 may fabricate a second circuit that operates in a second voltage domain. At block 630, method 600 may fabricate a logic gate coupled to the first circuit and the second circuit so as to receive a first control signal from the first circuit and a second control signal from the second circuit as inputs and provide a third control signal as an output in the first voltage domain based on the first control signal and the second control signal. At block 640, method 600 may fabricate a third circuit that receives the second control signal from the second circuit, holds a retention signal based on the second control signal, and provides the retention signal to the output of the logic gate.

In some implementations, the third circuit may hold the retention signal based on the second control signal when the first voltage domain rises to a high voltage state and when the second voltage domain stays in a low voltage state. The third circuit may also hold the retention signal based on the second control signal when the first voltage domain fully powers-up or fully rises to the high voltage state and when the second voltage domain starts to power-up or starts to rise to a high voltage state. Also, in some instances, the integrated circuit may operate as a power-on-reset (POR) circuit and as a level shifter, and as such, the second and third circuits may work together to provide POR functionality and level shift functionality.

Described herein are various implementations of an integrated circuit. The integrated circuit may include first devices arranged to operate as a latch, and the first devices may include inner devices and outer devices. The integrated circuit may include second devices that are coupled to the first devices and that are arranged to operate as a level shifter. The second devices may include upper devices and lower devices, and outputs of the lower devices may be cross-coupled to gates of the inner devices and the upper devices. The integrated circuit may include input signals applied to gates of the outer devices and the lower devices to thereby generate output signals from the outputs of the lower devices that are applied to the gates of the inner devices and the upper devices to activate latching of the output signals.

Described herein are various implementations of an integrated circuit. The integrated circuit may include a first circuit that operates in a first voltage domain, and the integrated circuit may include a second circuit that operates in a second voltage domain. The integrated circuit may include a logic gate that is coupled to the first circuit and the second circuit so as to receive a first control signal from the first circuit and a second control signal from the second circuit as inputs and provide a third control signal as an output in the first voltage domain based on the first control signal and the second control signal. The integrated circuit may include a third circuit that receives the second control signal from the second circuit, holds a retention signal based on the second control signal, and provides the retention signal to the output of the logic gate.

Described herein are various implementations of an integrated circuit. The integrated circuit may include power-on-reset (POR) circuitry having a first POR circuit for a first voltage domain (VDDCE) and a second POR circuit for a second voltage domain (VDDSOCE). The integrated circuit may include level shift latch circuitry that is coupled between the first POR circuit and the second POR circuit. The level shift latch circuitry may receive a retention signal. The level shift latch circuitry may up-shift the voltage from the second voltage domain to the first voltage domain. The level shift latch circuitry may latch the retention control signal after the second voltage domain powers-down.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   first devices arranged to operate as a latch, wherein the first devices include inner devices and outer devices, and wherein the first devices comprise N-type metal-oxide-semiconductor (NMOS) transistors;
   second devices coupled to the first devices and arranged to operate as a level shifter, wherein the second devices include upper devices and lower devices, wherein outputs of the lower devices are cross-coupled to gates of the inner devices and to gates of the upper devices, and wherein the second devices comprise solely P-type metal-oxide-semiconductor (PMOS) transistors; and
   input signals applied to gates of the outer devices and to gates of the lower devices to thereby generate output signals from the outputs of the lower devices, wherein the output signals are applied to the gates of the inner devices and to the gates of the upper devices to activate latching of the output signals,
   wherein a first outer device of the outer devices and a first lower device of the lower devices receive a first input signal of the input signals, and
   wherein a second outer device of the outer devices and a second lower device of the lower devices receive a second input signal of the input signals,
   wherein the output signals comprise feedback signals having a first feedback signal and a second feedback signal, and
   wherein the first feedback signal is output from the first lower device of the lower devices and applied solely to the gate of a first inner device of the inner devices, the gate of a first upper device of the upper devices, and to a node coupling drain terminals of a second inner device and a first outer device of the first devices.

2. The integrated circuit of claim 1, wherein the first input signal comprises a first retention signal (NRET) and the second input signal comprises a second retention signal (BRET).

3. The integrated circuit of claim 1, wherein the second feedback signal is output from the second lower device of the lower devices and applied to the gate of a second inner device of the inner devices and the gate of a second upper device of the upper devices.

4. The integrated circuit of claim 3, further comprising a logic gate coupled to the output of the second lower device of the lower devices, wherein the logic gate receives the second feedback signal from the second lower device of the lower devices.

5. The integrated circuit of claim 3, wherein the logic gate comprises an inverter, and wherein the inverter receives and inverts the second feedback signal so as to provide a complementary retention signal as a retention control output signal of the integrated circuit.

6. The integrated circuit of claim 1, wherein the input signals are applied to the gates of the outer devices and the lower devices to activate retention control.

7. The integrated circuit of claim 1, wherein the integrated circuit comprises a level shift latch that operates with level shifting functionality and latch functionality.

8. The integrated circuit of claim 1, wherein drain terminals of the upper devices of the second devices are coupled to source terminals of the lower devices of the second devices in a series arrangement.

* * * * *